United States Patent
Chang et al.

(10) Patent No.: US 10,634,706 B2
(45) Date of Patent: Apr. 28, 2020

(54) CORE POWER DETECTION CIRCUIT AND ASSOCIATED INPUT/OUTPUT CONTROL SYSTEM

(71) Applicant: Faraday Technology Corp., Hsin-Chu (TW)

(72) Inventors: Tang-Long Chang, Hsin-Chu (TW); Chi-Sheng Liao, Hsin-Chu (TW); Jeng-Huang Wu, Hsin-Chu (TW)

(73) Assignee: Faraday Technology Corp., Hsin-Chu (TW)

(*) Notice: Subject to any disclaimer, the term of this patent is extended or adjusted under 35 U.S.C. 154(b) by 39 days.

(21) Appl. No.: 15/949,044

(22) Filed: Apr. 9, 2018

(65) Prior Publication Data
US 2019/0204368 A1 Jul. 4, 2019

(30) Foreign Application Priority Data
Jan. 4, 2018 (TW) .............................. 107100313 A

(51) Int. Cl.
*H03K 17/22* (2006.01)
*G01R 21/133* (2006.01)
(Continued)

(52) U.S. Cl.
CPC ............ *G01R 21/133* (2013.01); *G05F 3/16* (2013.01); *G06F 1/266* (2013.01); *G06F 13/4004* (2013.01); *H03K 17/22* (2013.01)

(58) Field of Classification Search
CPC ..... G01R 21/133; G05F 3/16; G06F 13/4004; G06F 1/266; G06F 1/24; H03K 17/22
See application file for complete search history.

(56) References Cited

U.S. PATENT DOCUMENTS 5,280,198 A * 1/1994 Almulla ............... H03K 5/2481
327/142
5,847,586 A * 12/1998 Burstein ............... H03K 17/223
327/143
(Continued)

FOREIGN PATENT DOCUMENTS

CN    1905369 A    1/2007
CN    101163976 A    4/2008
(Continued)

OTHER PUBLICATIONS

"Digital Integrated Circuits Analysis and Design Second Edition", John E. Ayers, p. 293-p. 296, National Defense Industry Press, Beijing, Mar., 2013.

*Primary Examiner* — Jung Kim
(74) *Attorney, Agent, or Firm* — Winston Hsu

(57) ABSTRACT

A core power detection circuit and an associated input/output (I/O) control system are provided, where the core power detection circuit is utilized for performing power detection in the I/O control system to generate a core power detection signal to control the I/O control system, and the I/O control system operates according to a plurality of supply voltages with respect to a first reference voltage. The core power detection circuit includes: a reference power bias circuit arranged for generating a second reference voltage according to a first supply voltage of the plurality of supply voltages; and a comparison circuit, coupled to the reference power bias circuit, arranged for performing a comparison operation according to the second reference voltage and a second supply voltage of the plurality of supply voltages, to generate a third reference voltage.

13 Claims, 7 Drawing Sheets

(51) Int. Cl.
*G06F 13/40* (2006.01)
*G06F 1/26* (2006.01)
*G05F 3/16* (2006.01)

(56) References Cited

U.S. PATENT DOCUMENTS

| | | | |
|---|---|---|---|
| 7,570,091 B2 * | 8/2009 | Sugio | G06F 1/24 327/142 |
| 7,646,222 B2 | 1/2010 | Ichikawa | |
| 2008/0116945 A1 | 5/2008 | Sugio | |
| 2015/0355281 A1 | 12/2015 | Lee | |

FOREIGN PATENT DOCUMENTS

| | | |
|---|---|---|
| CN | 103185830 A | 7/2013 |
| CN | 103091526 B | 2/2015 |
| CN | 104601151 A | 5/2015 |
| CN | 106571803 A | 4/2017 |
| CN | 107436615 A | 12/2017 |
| TW | I486602 B | 6/2015 |
| TW | I597505 B | 9/2017 |

* cited by examiner

CORE POWER DETECTION CIRCUIT AND ASSOCIATED INPUT/OUTPUT CONTROL SYSTEM

BACKGROUND OF THE INVENTION

1. Field of the Invention

The present invention relates to circuit protection, and particularly, to a core power detection circuit and an associated input/output control system.

2. Description of the Prior Art

Conventional power detection architecture has some unresolved issues; in particular, an inappropriate design might cause a current leakage problem. In the conventional power detection architecture, the currents on multiple current paths between the supply voltage and the ground voltage are strong, and must pass through many active or passive elements, resulting in unacceptable power consumption. A novel architecture is required to improve the control mechanism of power detection.

SUMMARY OF THE INVENTION

One of the objectives of the present invention is therefore to provide a core power detection circuit and an associated input/output (I/O) control system in order to solve the aforementioned problem.

Another objective of the present invention is to provide a core power detection circuit and an associated I/O control system to reduce the current leakage and lower the power consumption.

According to at least one embodiment of the present invention, a core power detection circuit is disclosed. The core power detection circuit is arranged to execute power detection in an I/O control system to generate a core power detecting signal for controlling the I/O control system. The I/O control system operates according to a plurality of supply voltages with respect to a first reference voltage. The core power detection circuit comprises: a reference power bias circuit arranged to generate a second reference voltage according to a first supply voltage of the plurality of supply voltages; and a comparison circuit coupled to the reference power bias circuit and arranged to execute a comparison according to a second supply voltage of the plurality of supply voltages and the second reference voltage to generate a third reference voltage, wherein the second supply voltage is smaller than the first supply voltage. In addition, the reference power bias circuit comprises: a group of voltage-division components coupled between a first supply voltage wire and a reference voltage wire, wherein the first supply voltage wire and the reference voltage wire are arranged to conduct the first supply voltage and the first reference voltage respectively, and a voltage on a terminal between two of the group of voltage-division components is referred to as the second reference voltage. The comparison circuit comprises: a first group of Field Effect Transistors (FETs), coupled between the first supply voltage wire and the reference voltage wire. The first group of FETs comprises a first p-type FET and a first n-type FET, wherein source terminals of the first p-type FET and the first n-type FET are coupled to the first supply voltage wire and the reference voltage wire, respectively, drain terminals of the first p-type FET and the first n-type FET are coupled to each other, gate terminals of the first p-type FET are coupled to the terminal between two of the voltage-division components to receive the second reference voltage, the n-type FET is coupled between a second supply voltage wire and the reference voltage wire via a gate terminal and a source terminal of the n-type FET, and the second supply voltage wire is arranged to conduct the second supply voltage. In addition, the core power detection circuit utilizes the third reference voltage or its derivative as the core power detection signal, and the configuration of the core power detection circuit makes the core power detection signal indicate if the second supply voltage is in a ready state to allow a partial circuit of the I/O control system to operate when the second supply voltage is in the ready state. For example, the I/O control system may comprise an I/O network operating under the first supply voltage, wherein the partial circuit in the I/O control system represents the I/O network.

According to at least one embodiment of the present invention, the I/O control system comprises the aforementioned core power detection circuit, wherein the I/O control system comprises an I/O network operating under the first supply voltage, and the partial circuit in the I/O control system represents the I/O network. The I/O network comprises a first group of logic circuits, coupled between the first supply voltage wire and the reference voltage wire.

The core power detection circuit of the present invention can solve the problems in the prior art without introducing any side effects or in a way which is less likely to introduce side effects.

The core power detection circuit of the present invention may cause the first supply voltage to have a very small direct current (DC) power leakage current via a special connection in the reference power bias circuit. Said very small DC power leakage current is smaller than 10 nano-amperes (nA). In another example, said very small DC power leakage current is smaller than 2 nA. More particularly, the DC power leakage current can be 1.75 nA. In addition, compared to the prior art, the power consumption of the core power detection circuit is greatly reduced.

These and other objectives of the present invention will no doubt become obvious to those of ordinary skill in the art after reading the following detailed description of the preferred embodiment that is illustrated in the various figures and drawings.

DETAILED DESCRIPTION

The following embodiments of the present invention provide a core power detection circuit and an associated input/output (I/O) control system, wherein the core power detection circuit is arranged to execute power detection in the I/O control system in order to generate a core power detection signal for controlling the I/O control system. The I/O control system operates according to a plurality of supply voltages with respect to a first reference voltage. The first reference voltage may represent a ground voltage; however, this is not a limitation of the present invention. Consider that one of the plurality of supply voltages may not be stable. In this situation, the abnormal voltage level of the supply voltage may cause a partial circuit of the I/O control system to mistakenly operate or stay in an abnormal state which may cause another partial circuit of the I/O control system to mistakenly operate or stay in an abnormal state. The core power detection circuit of the present invention may solve this problem without introducing any side effects or in a way which is less likely to introduce side effects.

Figure 1:
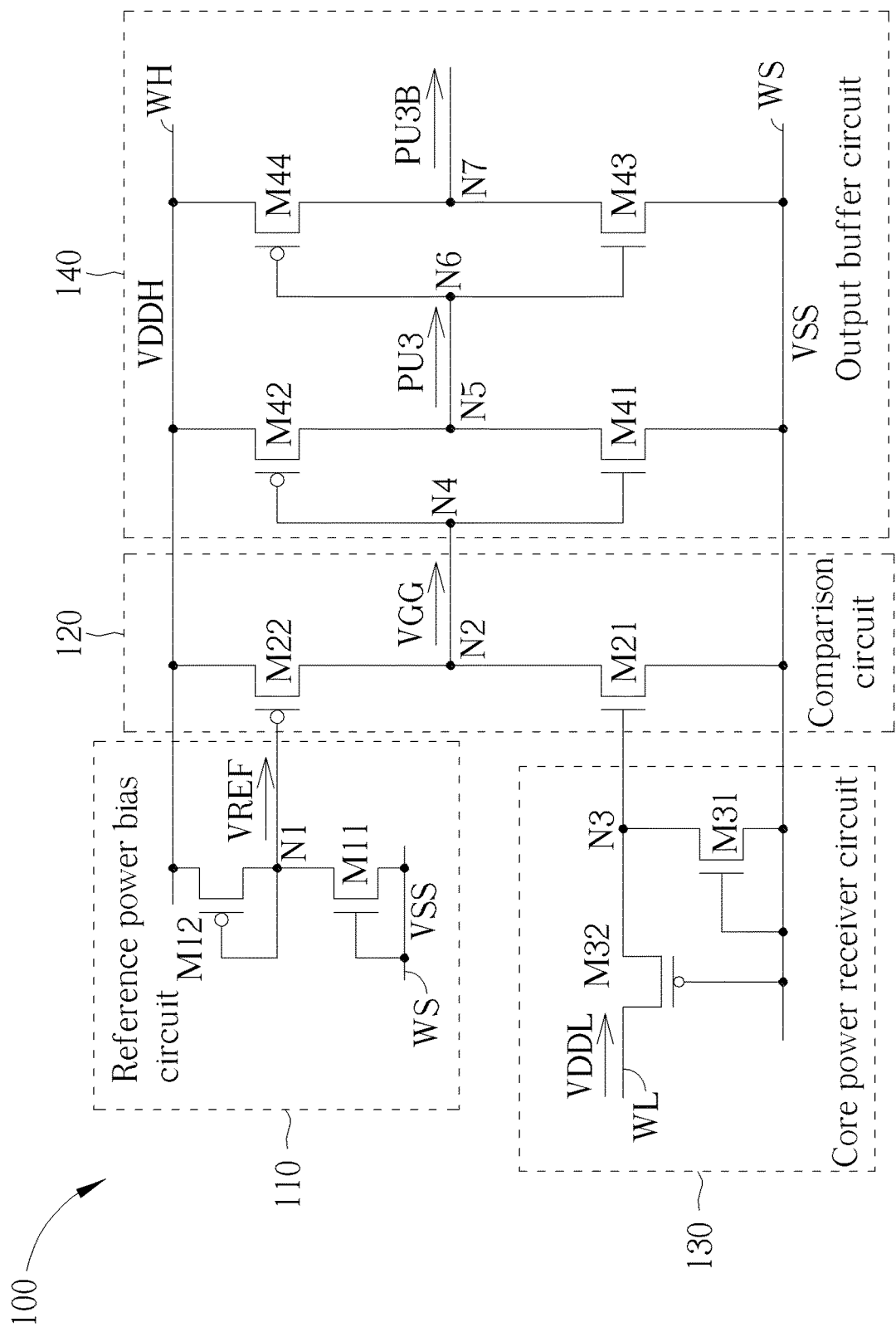
FIG. 1 is a diagram illustrating a core power detection circuit according to an embodiment of the present invention.

FIG. 1 is a diagram illustrating a core power detection circuit 100 according to an embodiment of the present invention. The core power detection circuit 100 may be an example of the aforementioned core power detection circuit, a reference voltage VSS may be an example of the aforementioned first reference voltage, and a first supply voltage VDDH and a second supply voltage VDDL may be examples of the aforementioned plurality of supply voltages. The core power detection circuit 100 may comprise a reference power bias circuit 110, a comparison circuit 120, a core power receiver circuit 120 and an output buffer circuit 140, wherein at least a part of these circuits (e.g. a part or all) can be implemented by Field Effect Transistors (FET), and more particularly, by Metal Oxide Semiconductor Field Effect Transistors (MOSFET). This is not a limitation of the present invention, For example, the FETs M11, M21, M31, M41 and M43 are N-type FETs, e.g. N-type MOSFETs (or so called NMOSFETs), and FETs M12, M22, M32, M42 and M44 are P-type FETs, e.g. P-type MOSFETs (or so called PMOSFETs). For better comprehension, FIG. 1 depicts a plurality of wires such as a reference voltage wire WS for conducting the reference voltage VSS, a first supply voltage wire WH for conducting the first supply voltage VDDH, and a second supply voltage wire WL for conducting the second supply voltage VDDL. Drain terminals of the FETs {M11, M12} are coupled to each other, a terminal N1 is located between the drain terminals, and each of the FETs {M11, M12} is coupled between the reference voltage wire WS and the first supply voltage wire WH via a respective source terminal; drain terminals of the FETs {M21, M22} are coupled to each other, a terminal N2 is located between the drain terminals, and each of the FETs {M21, M22} is coupled between the reference voltage wire WS and the first supply voltage wire WH via a respective source terminal; drain terminals of the FETs {M31, M32} are coupled to each other, a terminal N3 is located between the drain terminals, and each of the FETs {M31, M32} is coupled between the reference voltage wire WS and the second supply voltage wire WL via a respective source terminal; gate terminals of the FETs {M41, M42} are coupled to each other, a terminal N4 is located between the gate terminals, drain terminals of the FETs {M41, M42} are coupled to each other, a terminal N5 is located between the drain terminal, and each of the FETs {M41, M42} is coupled between the reference voltage WS and the first supply voltage WH via a respective source terminal; and gate terminals of FETs {M43, M44} are coupled to each other, a terminal N6 is located between the gate terminals, drain terminals of the FETs {M43, M44} are coupled to each other, a terminal N7 is located between the drain terminals, and each of the FETs {M43, M44} is coupled between the reference voltage wire WS and the first supply voltage wire WH via a respective source terminal; however, this is not a limitation of the present invention.

According to this embodiment, the reference power bias circuit 110 may generate a reference voltage VREF according to a first supply voltage VDDH of the plurality of supply voltages, and output the reference voltage VREF to the comparison circuit 120 (e.g. the FET M22 therein) via the terminal N1. The comparison circuit 120 may execute a comparison according to a part of the second supply voltage VDDL and the reference voltage VREF to generate a reference voltage VGG, wherein the second supply voltage VDDL is smaller than the first supply voltage VDDH. This is not a limitation of the present invention, however. In addition, the core power receiver circuit 130 may convert the second supply voltage VDDL into an intermediate voltage corresponding to the second supply voltage VDDL such like a voltage-division result of the second supply voltage VDDL, and the intermediate voltage can be utilized as the part of the second supply voltage VDDL, wherein the intermediate voltage is extracted from the terminal N3, and is smaller than the second supply voltage VDDL. The core power receiver circuit 130 may output the intermediate voltage to the comparison circuit 120 (e.g. the FET M21 thereof) via the terminal N3, wherein a gate terminal of the FET M21 may couple to the core power receiver circuit 130 to receive the intermediate voltage. In addition, the output buffer circuit 140 may comprise one or more output buffers such like a plurality of output buffers, wherein each of the one or more output buffers comprises a Complementary Metal-Oxide-Semiconductor (CMOS) circuit, and the CMOS circuit comprises a set of FETs coupled to each other which is coupled between the first supply voltage wire WH and the reference voltage wire WS. For example, a first output buffer of the plurality of output buffers may comprise FETs {M41, M42}, and a second output buffer of the plurality of output buffers may comprise FETs {M43, M44}. However, this is not a limitation of the present invention. The output buffer circuit 140 may convert the reference voltage VGG into another reference voltage (e.g. the reference voltage PU3 or the reference voltage PU3B) as the core power detection signal.

The set of FETs {M31, M32} in the reference power receiver circuit 130 may couple between the reference voltage wire WS and the second supply voltage wire WL, and can be utilized to generate the intermediate voltage, wherein source terminals of the FETs M31 and M31 may couple to the second supply voltage wire WL and the reference voltage wire WS respectively, drain terminals of the FETs M31 and M32 may couple to each other and couple to a gate terminal of the FET M21 to provide the intermediate voltage to the gate terminal of the FET M21. A gate terminal of the FET M32 is coupled to the reference voltage wire WS, and a gate terminal of the FET M31 is coupled to the reference voltage wire WS. In addition, the set of FETs {M11, M12} in the reference power bias circuit 110 may be coupled between the reference voltage wire WS and the first supply voltage wire WH, and can be utilized as two voltage-division components, wherein source terminals of the FETs M12 and M11 may be coupled to the first supply voltage wire WH and the reference voltage wire WS, respectively, drain terminals of the FETs M12 and M11 may couple to each other, a gate terminal of the FET M12 may couple to one of the reference voltage VREF and the first reference voltage (e.g. the reference voltage VSS), and a gate terminal of the FET M11 may couple to the reference voltage wire WS. However, this is not a limitation of the present invention. Based on the architecture shown in FIG. 1, the core power detection circuit 100 may utilize a derivative of the reference voltage VGG such as another reference voltage (e.g. the reference voltage PU3 or the reference voltage PU3B) as the core power detection signal. The configuration of the core power detection circuit 100 may make the core power detection signal indicate if the second supply voltage VDDL is in a ready state to allow a partial circuit of the I/O control system to operate when the second supply voltage VDDL is in the ready state.

Figure 2:
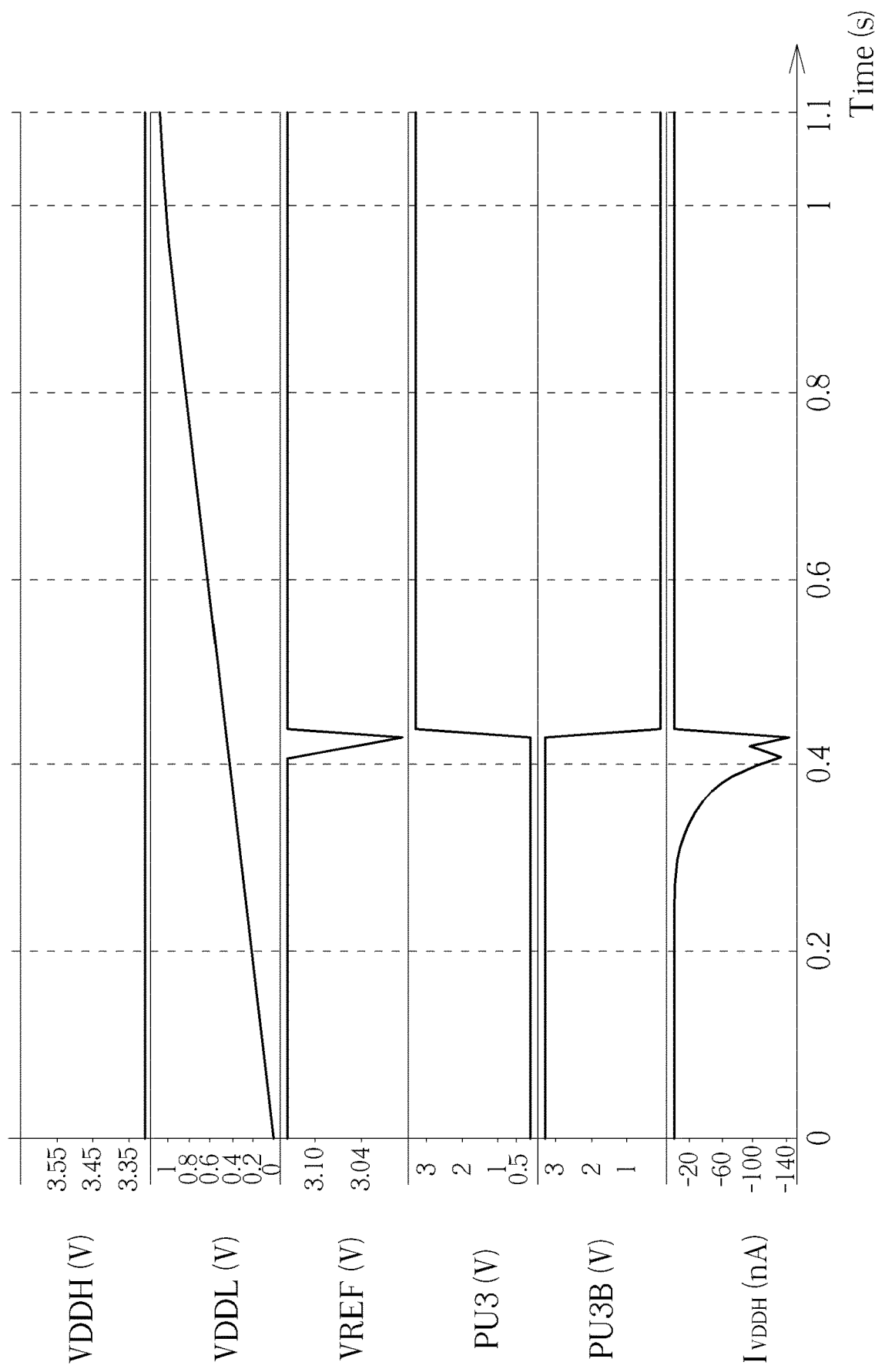
FIG. 2 is a diagram illustrating voltage/current characteristics of the core power detection circuit shown in FIG. 1 according to an embodiment of the present invention.

FIG. 2 is a diagram illustrating a voltage/current characteristic of the core power detection circuit 100 shown in FIG. 1 according to an embodiment of the present invention, wherein the unit of voltage may be volts (V), the unit of current may be nano-amperes (nA), and the unit of time may be seconds (s). For better comprehension, FIG. 2 depicts a plurality of voltages such as the first supply voltage VDDH, the second supply voltage VDDL and the reference voltages VREF, PU3 and PU3B, and also depicts a current $I_{VDDH}$, wherein the reference voltage VGG may be equal to the reference voltage PU3B, and the current $I_{VDDH}$ may represent a sum of the currents on a plurality of current paths flowing from the first supply voltage VDDH to the reference voltage VSS. This is not a limitation of the present invention, however. Please note that the configuration of the core power receiver circuit 130 may delay a state-transition time of the reference voltage VGG to prevent the core power detection signal from indicating if the second supply voltage VDDL is in the ready state before it is in the ready state. In addition, in the core power detection circuit 100, a direct current (DC) leakage current of the first supply voltage VDDH may be smaller than 10 nA, wherein the configuration of the reference power bias circuit 110 may make the DC power leakage current of the first supply voltage VDDH smaller than 10 nA. More particularly, in the core power detection circuit 100, the DC power leakage current of the first supply voltage VDDH may be smaller than 2 nA (e.g. the DC power leakage current may be equal to 1.75 nA in this embodiment), wherein the configuration of the reference power bias circuit 110 may make the DC power leakage current of the first supply voltage VDDH smaller than 2 nA. Therefore, compared to the prior art, the power consumption of the present invention is insignificant.

Figure 3:
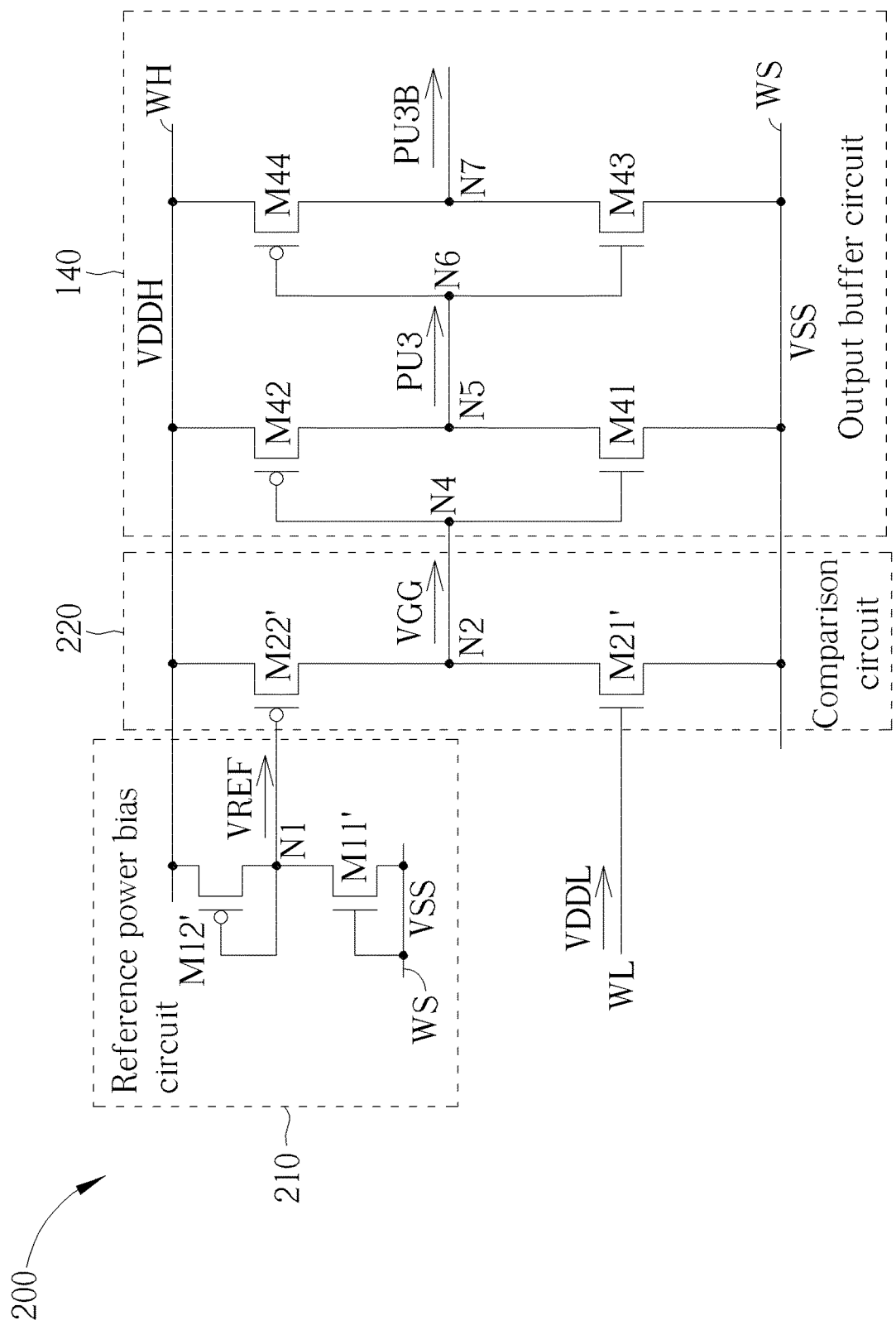
FIG. 3 is a diagram illustrating a core power detection circuit according to another embodiment of the present invention.

FIG. 3 is a diagram illustrating a core power detection circuit 200 according to another embodiment of the present invention. Compared to the core power detection circuit 100 shown in FIG. 1, the core power receiver circuit 130 does not need to be installed in this embodiment; correspondingly, the aforementioned FETs M11, M12, M21 and M22 can be replaced with FETs M11', M12', M21' and M22' shown in this embodiment, where corresponding indexes such as "100", "110" and "120" are changed to "200", "210" and "220". According to this embodiment, a gate terminal of the FET M21' may be connected to the second supply voltage wire WL for receiving the second supply voltage VDDL. Compared to the FETs M11, M12, M21 and M22, the channel characteristics of the FETs M11', M12', M21' and M22' may delay the transition time of the reference voltage VGG to prevent the core power detection signal from indicating if the second supply voltage VDDL is in the ready state before it is in the ready state. For example, the channel of the FET M11' may be implemented as a FET with a channel which has higher conductivity than that of the FET M11, and more particularly, the FET M11' is generated by broadening and shortening the channel of the FET M11; the channel of the FET M12' may be implemented as a FET with a channel which has lower conductivity than that of the FET M11, and more particularly, the FET M12' is generated by narrowing and lengthening the channel of the FET M12; the channel of the FET M21' may be implemented as a FET with a channel which has lower conductivity than that of the FET M21, and more particularly, the FET M21' is generated by narrowing and lengthening the channel of the FET M21; and/or the channel of the FET M22' may be implemented as a FET with a channel which has higher conductivity than that of the FET M22, and more particularly, the FET M22' is generated by broadening and shortening the channel of the FET M221; however, this is not a limitation of the present invention. In the case where the four examples mentioned above are all implemented, the FETs M11', M12', M21' and M22' can be generated by adjusting the channels of the FETs M11, M12, M21 and M22, respectively.

According to some embodiments, at least a part (e.g. a part or all) of the four examples mentioned above can be chosen to be implemented. In a situation where at least one of the four examples mentioned above (e.g. one or more than one example) is implemented, at least one of the FETs M11', M12', M21' and M22' (e.g. one or more than one FET) can be generated by adjusting the channel (s) of at least one corresponding FET of the FETs M11, M12, M21 and M22 shown in FIG. 1 (e.g. the FET(s) of the FETS M11, M12, M21 and M22 which correspond to said one or more FETs), wherein one or more than one (if they exist) of the FETs M11', M12' M21' and M22 can be regarded as one or other FETs of the FETs M11, M12, M21 and M22.

According to some embodiments, at least one part (e.g. a part or all) of the first two examples of the four examples mentioned above can be chosen to be implemented. In a situation where one of the two examples is implemented, one specific FET of the FETs M11' and M12' (e.g. the FET M11' or the FET M12') can be generated by adjusting the channel of a corresponding FET of the FETs M11 and M12 (e.g. the FET M11 or the FET M12) shown in FIG. 1, wherein the other FET of the FETs M11' and M12' can be regarded as the other FET of the FETs M11 and M12. In a situation where both of the two examples are implemented, the FETs M11' and M12' can be generated by adjusting the channels of the FETs M11 and M12 shown in FIG. 1. Assume that the reference voltage VREF generated by the reference power bias circuit 110 via the FETs M11 and M12 may be equal to 3.14V. For example, no matter which one of the two abovementioned situations applies, the reference voltage VREF generated by the reference power bias circuit 210 via the FETs M11' and M12' may be smaller than or equal to 3V.

Figure 4:
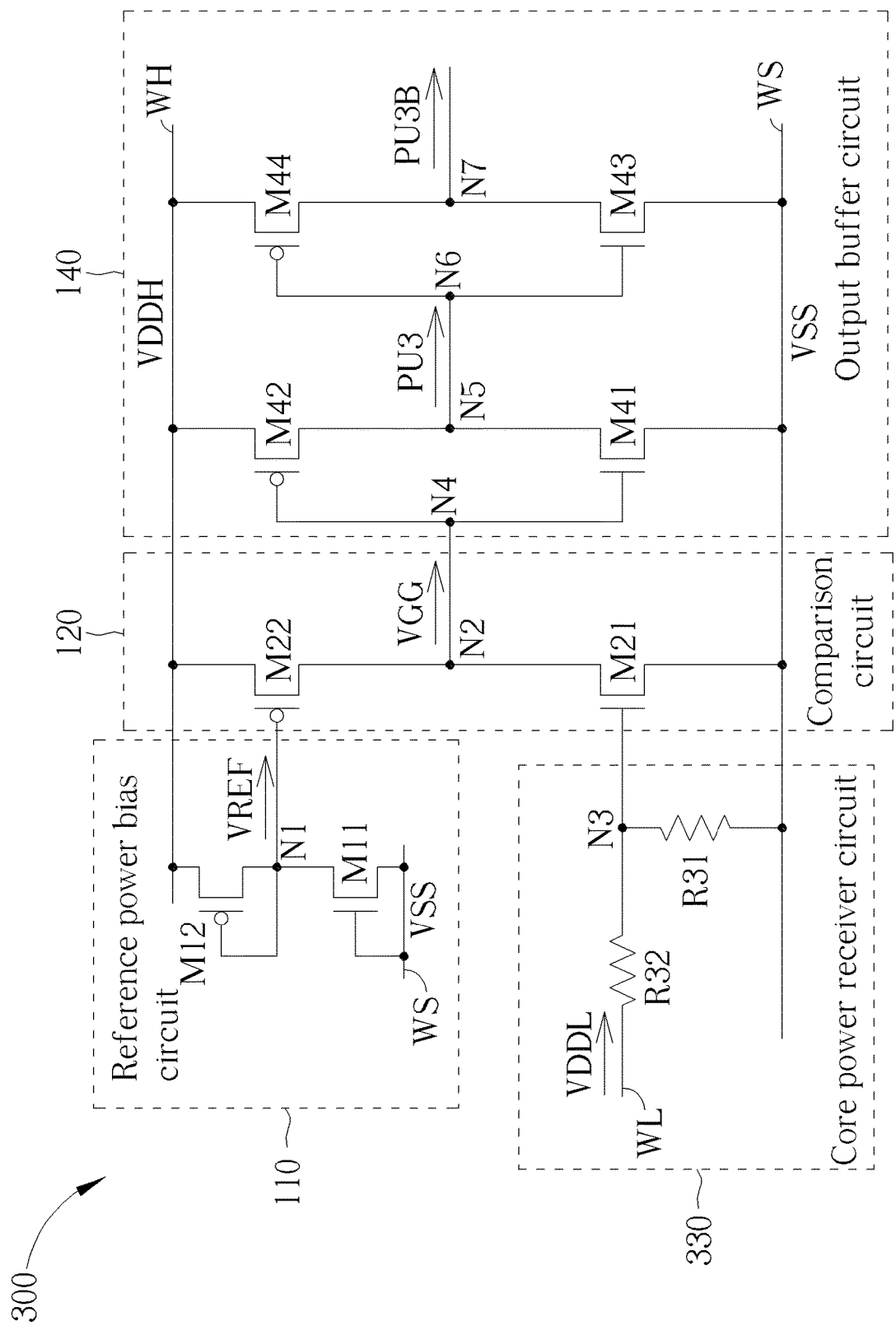
FIG. 4 is a diagram illustrating a core power detection circuit according to another embodiment of the present invention.

FIG. 4 is a diagram illustrating a core power detection circuit 300 according to another embodiment of the present invention. Compared to the core power detection circuit 100 shown in FIG. 1, the abovementioned FETs M31 and M32 can be replaced with the resistors R31 and R32 in this embodiment, wherein the indexes such as "100" and "130" can be changed to "300" and "330". The group of resistors {R31, R32} in the core power receiver circuit 330 may be coupled between the reference voltage wire WS and the second supply voltage wire WL, and can be arranged to generate the intermediate voltage, wherein first terminals of the resistors R32 and R31 may be coupled to the second supply voltage wire WL and the reference voltage wire WS, respectively, second terminals of the resistors R32 and R31 may be coupled to each other and to the gate terminal of the FET M21 to provide the intermediate voltage thereto, and the resistance values of the resistor R32 and R31 may be greater than a turn-on resistance value of any of the FET M22 and M21 by at least one magnitude. This is not a limitation of the present invention, however.

Figure 5:
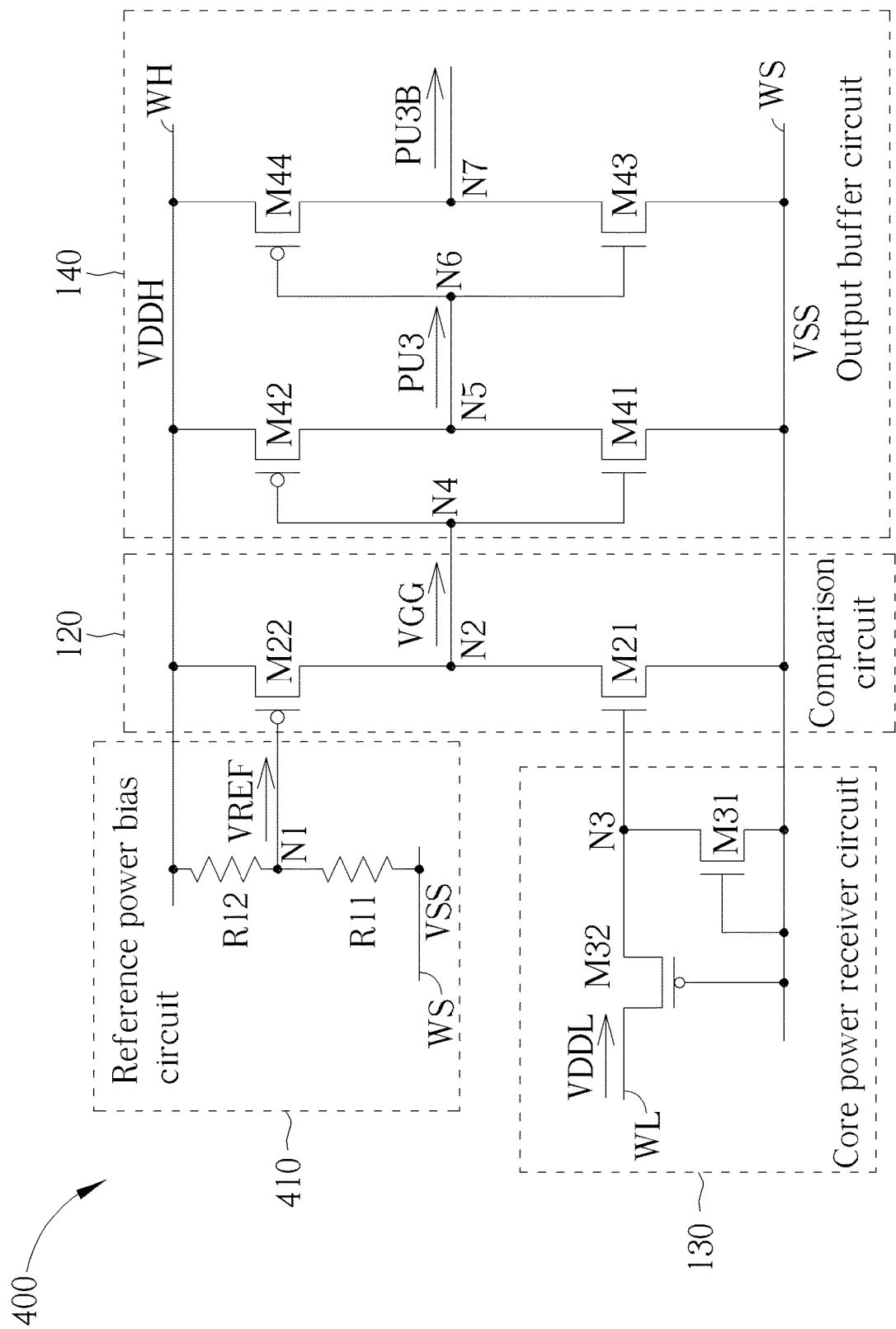
FIG. 5 is a diagram illustrating a core power detection circuit according to another embodiment of the present invention.

FIG. 5 is a diagram illustrating a core power detection circuit 400 according to another embodiment of the present invention. Compared to the core power detection circuit 100 shown in FIG. 1, the aforementioned FETs M11 and M12 are replaced with the resistors R11 and R12 in this embodiment, wherein the indexes such as "100" and "110" can be changed to "400" and "410". The group of resistors {R11, R12} of the reference power bias circuit 410 may be coupled between the reference voltage wire WS and the first supply voltage wire WH, and can be arranged to be two voltage-division components, wherein first terminals of the resistors R12 and R11 may be coupled to the first supply voltage wire WH and the reference voltage wire WS, respectively, second terminals of the resistors R12 and R11 may be coupled to each other, and resistance values of the resistors R12 and R11 may be greater than the turn-on resistance value of any of the FETs M22 and M21 by at least one magnitude. This is not a limitation of the present invention, however.

According to some embodiments, the reference power bias circuit of the aforementioned core power detection circuits (e.g. any of the core power detection circuits 100, 200, 300 and 400) may comprise a group of voltage-division components which may be coupled between the first supply voltage wire WH and the reference voltage wire WS, wherein the group of voltage-division components may comprise the two voltage-division components, and a terminal (e.g. the terminal N1) between the two voltage-division components can be referred to as the reference voltage VREF. In addition, the gate terminal of the FET M22 may be coupled to the terminal (e.g. the terminal N1) to receive the reference voltage VREF, the FET M21 may be coupled between the second supply voltage wire WL and the reference voltage wire WS via the gate terminal and the source terminal thereof. This is not a limitation of the present invention, however. In addition, the core power detection circuit may utilize the reference voltage VGG or the derivative (e.g. the reference voltage PU3 or the reference voltage PU3B) as the core power detection signal, and the configuration of the core power detection circuit may make the core power detection signal indicate if the second supply voltage VDDL is in the ready state to allow the partial circuit of the I/O control system to operate when the second supply voltage VDDL is in the ready state. Similarities between this embodiment and the aforementioned embodiments are omitted here.

According to some embodiments, except for the core power detection circuit, the I/O control system may comprise an I/O network operating under the first supply voltage VDDH, and may further comprise a core network operating under the second supply voltage VDDL, wherein the above-mentioned partial circuit of the I/O control system may represent the I/O network. For example, the I/O network may comprise a first group of logic circuits coupled between the first supply voltage wire WH and the reference voltage wire WS. In addition, the core network may comprise a second group of logic circuits coupled between the second supply voltage wire WL and the reference voltage wire WS.

Figure 6:
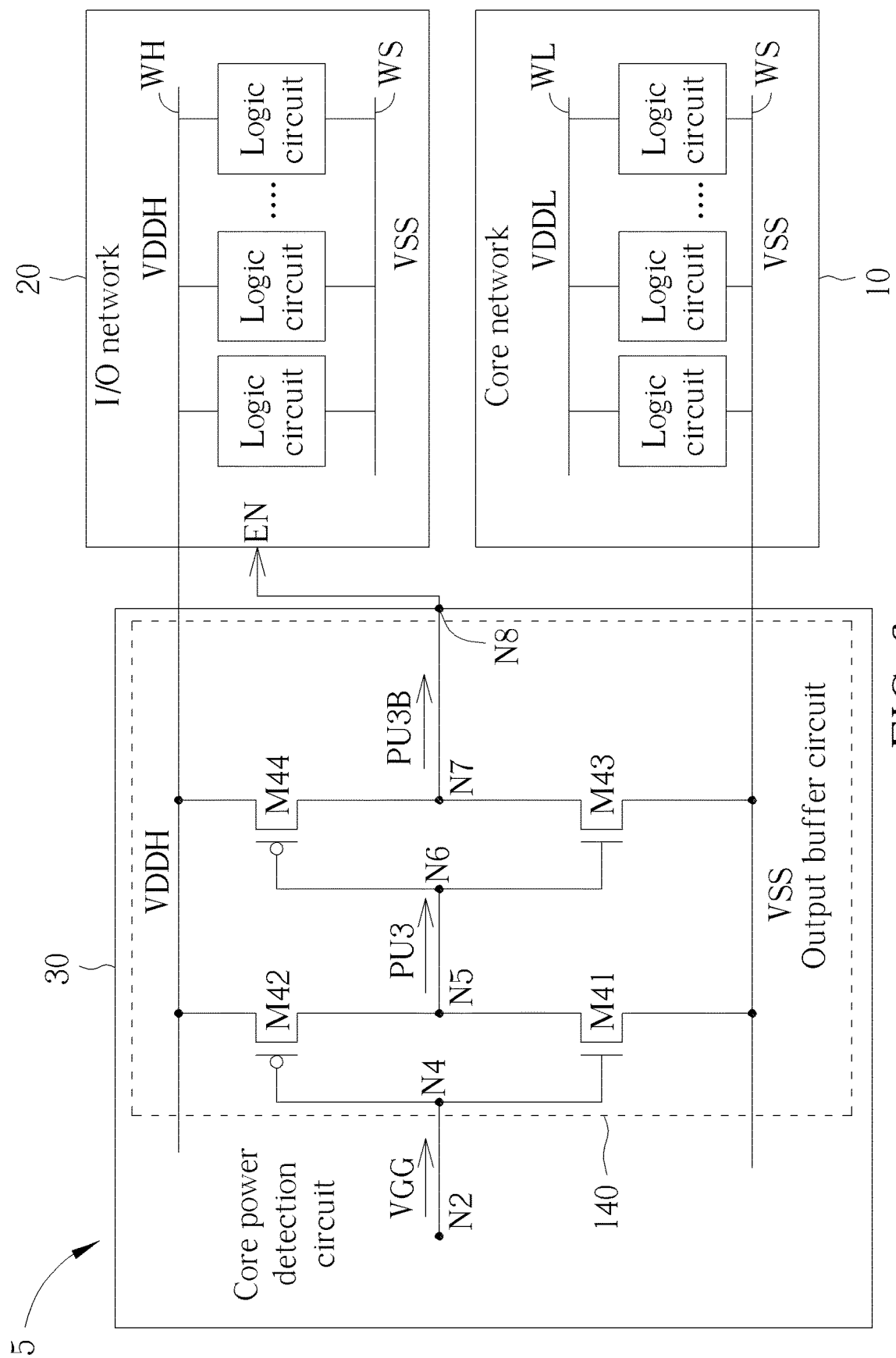
FIG. 6 is a diagram illustrating an input/output control system according to an embodiment of the present invention.

FIG. 6 is a diagram illustrating an input/output control system 5 according to an embodiment of the present invention. The I/O control system 5 can be an example of the aforementioned I/O control system. The I/O control system 5 may comprise a core network 10, an I/O network 20 and a core power detection circuit 30 (e.g. any of the core power detection circuits 100, 200, 300 and 400), wherein the core network 10 can be an example of the aforementioned network, and the I/O network 20 can be an example of the aforementioned I/O network. Assume that a terminal N8 is located on an output terminal of the core power detection circuit 30. Through the terminal N8, the core power detection circuit 30 may output the reference voltage PU3B to the I/O network 20 as an enable signal. An enable terminal En of the I/O network 20 can be arranged to receive the core power detection signal such as the reference voltage PU3B. Similarities between this embodiment and the aforementioned embodiments are omitted here.

Figure 7:
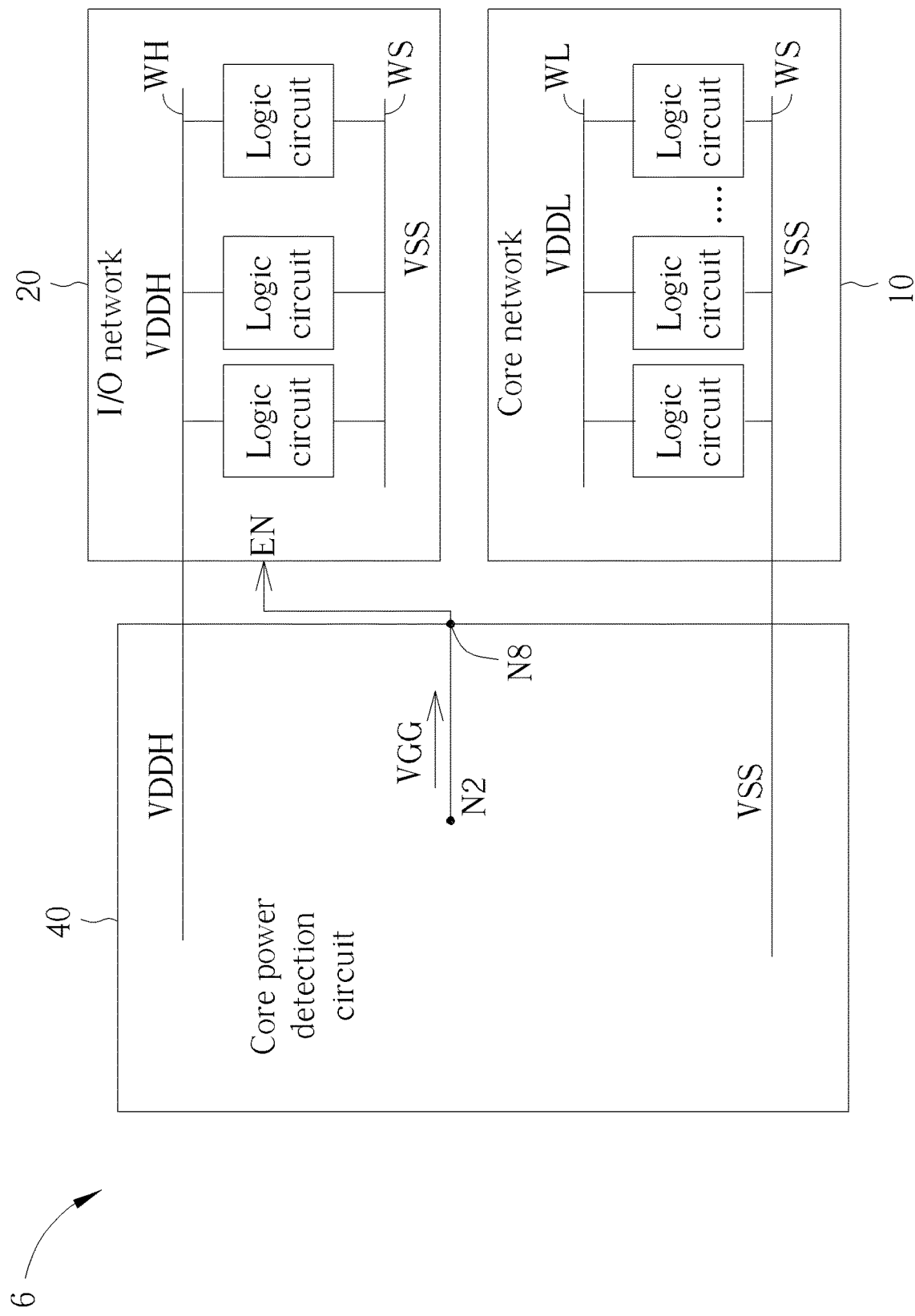
FIG. 7 is a diagram illustrating another input/output control system according to an embodiment of the present invention.

FIG. 7 is a diagram illustrating another input/output control system 6 according to an embodiment of the present invention. The I/O control system 6 can be an example of the aforementioned I/O control system. The I/O control system 6 may comprise a core network 10, an I/O network 20 and a core power detection circuit 40 (e.g. the core power detection circuit 30 without the output buffer circuit 140, such as any of the core power detection circuits 100, 200, 300 and 400 without the output buffer circuit 140). Assume that the terminal N8 is located on an output terminal of the core power detection circuit 40, wherein the terminal N8 is directly connected to the terminal N2. Through the terminal N8, the core power detection circuit 40 can output the reference voltage VGG to the I/O network 20 as the enable signal. The enable terminal EN of the I/O network 20 can be arranged to receive the core power detection signal such as the reference voltage VGG. Similarities between this embodiment and the aforementioned embodiments are omitted here.

According to some embodiments, the core network 10 and the I/O network 20 can be coupled to each other; however, this is not a limitation of the present invention. The aforementioned core power detection circuit (e.g. any of the core power detection circuits 30 and 40) can be configured to transmit the core power detection signal (e.g. the reference voltage PU3B or the reference voltage VGG) to the I/O network 20, and may comprise an adjustable power increase/decrease detector (e.g. the circuit of any of the core power detection circuits 30 and 40 located on the left side of the terminal N2), wherein the power increase/decrease detector may be configured to detect a power state of the core network 10 to generate the core power detection signal. For example, the core power detection signal may indicate the state of the core power (e.g. the power of the core network 10 such as the second supply voltage VDDL). This is not a limitation of the present invention, however. When the core power is in an unknown state, by using the core power detection signal, the I/O control system may control the I/O network 20 properly, e.g. may make the I/O network 20 stay in a known state. In addition, according to the state of the core power detection signal, the I/O control system may selectively enable or disable the I/O network 20. This is not a limitation of the present invention, however. For example, when a first state (e.g. a first voltage level) of the core power detection signal indicates that the second supply voltage VDDL is not in the ready state, the I/O control system may disable the I/O network 20. In another example, when a second state (e.g. a second voltage level) of the core power detection signal indicates that the second supply voltage VDDL is in the ready state, the I/O control system may enable the I/O network 20.

According to some embodiments, advanced processes may be utilized such as a 28 nanometer (nm) process, 40 nm process and 55 nm process, etc. to implement the I/O control system and the core power detection circuit therein (e.g. any of the core power detection circuits 30 and 40). Compared to the prior art, the architecture proposed by the present invention not only achieves the goal of lowering the power consumption, but also can be applied to electronic products utilizing advanced processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A core power detection circuit, arranged to execute power detection in an input/output (I/O) control system to generate a core power detection signal for controlling the I/O control system, the I/O control system operating according to a plurality of supply voltages with respect to a first reference voltage, the core power detection circuit comprising:
a reference power bias circuit, arranged to generate a second reference voltage according to a first supply voltage of the plurality of supply voltages, wherein the reference power bias circuit comprises:
a group of voltage-division components, coupled between a first supply voltage wire and a reference voltage wire, each voltage-division component within the group of voltage-division components being an active component having at least three terminals, said at least three terminals comprising two terminals through which the group of voltage-division components are connected in series to form a serial connection between the first supply voltage wire and the reference voltage wire, said at least three terminals further comprising another terminal differing from the two terminals, said another terminal differing from the two terminals being electrically and directly connected to the reference voltage wire for one of the group of voltage-division components that is closest to the reference voltage wire along a connection path on the serial connection, or being electrically and directly connected to either the second reference voltage or the reference voltage wire for one of the group of voltage-division components that is not closest to the reference voltage wire along the connection path on the serial connection, wherein the first supply voltage wire and the reference voltage wire are arranged to conduct the first supply voltage and the first reference voltage, respectively, and a voltage on a terminal between two voltage-division components of the group of voltage-division components is utilized as the second reference voltage; and
a comparison circuit, coupled to the reference power bias circuit, arranged to execute a comparison operation according to at least a part of a second supply voltage of the plurality of supply voltages and the second reference voltage to generate a third reference voltage, wherein the second supply voltage is less than the first supply voltage, and the comparison circuit comprises:
a first group of Field Effect Transistors (FETs), coupled between the first supply voltage wire and the reference voltage wire, wherein the first group of FETs comprises:
a first P-type FET and a first N-type FET, wherein source terminals of the first P-type FET and the first N-type FET are coupled to the first supply voltage wire and the reference voltage wire, respectively, drain terminals of the first P-type FET and the first N-type FET are coupled to each other, a gate terminal of the first P-type FET is coupled to the terminal between the two voltage-division components to receive the second reference voltage, the first N-type FET is coupled to a second supply voltage wire and the reference voltage wire via a gate terminal and a source terminal of the first N-type FET, respectively, and the second supply voltage wire is arranged to conduct the second supply voltage;
wherein the group of voltage-division components comprises:
a second group of FETs, coupled between the first supply voltage wire and the reference voltage wire, wherein the second group of FETs comprises:
a second P-type FET and a second N-type FET, arranged to be the two voltage-division components, wherein source terminals of the second P-type FET and the second N-type FET are coupled to the first supply voltage wire and the reference voltage wire, respectively, drain terminals of the second P-type FET and the second N-type FET are coupled to each other, a gate terminal of the second P-type FET is electrically and directly connected to one of the second reference voltage and the first reference voltage, and a gate terminal of the second N-type FET is electrically and directly connected to the reference voltage wire;
wherein the core power detection circuit utilizes the third reference voltage or a derivative of the third reference voltage as the core power detection signal, and a configuration of the core power detection circuit makes the core power detection signal indicate if the second supply voltage is in a ready state to allow a partial circuit of the I/O control system to operate when the second supply voltage is in the ready state.

2. The core power detection circuit of claim 1, further comprising:
an output buffer circuit comprising one or more output buffers, arranged to convert the third reference voltage into another reference voltage as the core power detection signal, wherein each of the one or more output buffers comprises:
a complementary Metal-Oxide-Semiconductor (CMOS) circuit, wherein the CMOS circuit comprises a group of FETs coupled to each other, and the group of FETs coupled to each other is coupled between the first supply voltage wire and the reference voltage wire.

3. The core power detection circuit of claim 2, further comprising:
a core power receiver circuit, coupled to the second supply voltage wire, arranged to convert the second supply voltage into an intermediate voltage corresponding to the second supply voltage, wherein the intermediate voltage is less than the second supply voltage, and the gate terminal of the first N-type FET is coupled to the core power receiver circuit to receive the intermediate voltage.

4. The core power detection circuit of claim 1, further comprising:
a core power receiver circuit, coupled to the second supply voltage wire, arranged to convert the second supply voltage into an intermediate voltage corresponding to the second supply voltage, wherein the intermediate voltage is less than the second supply voltage, and the gate terminal of the first N-type FET is coupled to the core power receiver circuit to receive the intermediate voltage.

5. The core power detection circuit of claim 4, wherein the core power receiver circuit comprises:
    a third group of FETs coupled between the second supply voltage wire and the reference voltage wire, wherein the third group of FETs comprises:
        a third P-type FET and a third N-type FET arranged to generate the intermediate voltage, wherein source terminals of the third P-type FET and the third N-type FET are coupled to the second supply voltage wire and the reference voltage wire, respectively, drain terminals of the third P-type FET and the third N-type FET are coupled to each other and coupled to the gate terminal of the first N-type FET to provide the intermediate voltage to the gate terminal of the first N-type FET, a gate terminal of the third P-type FET is coupled to the reference voltage wire, and a gate terminal of the third N-type FET is coupled to the reference voltage wire.

6. The core power detection circuit of claim 4, wherein a configuration of the core power receiver circuit delays a state-transition time of the third reference voltage to prevent the core power detection signal from indicating that the second supply voltage is in the ready state before the second supply voltage is in the ready state.

7. The core power detection circuit of claim 1, wherein in the core power detection circuit, a direct current (DC) power leakage current of the first supply voltage is less than 10 nano-amperes (nA).

8. The core power detection circuit of claim 7, wherein in the core power detection circuit, the DC power leakage current of the first supply voltage is less than 2 nA.

9. The core power detection circuit of claim 8, wherein a configuration of the reference power bias circuit makes the DC power leakage current of the first supply voltage less than 2 nA.

10. The core power detection circuit of claim 7, wherein a configuration of the reference power bias circuit makes the DC power leakage current of the first supply voltage less than 10 nA.

11. The core power detection circuit of claim 1, wherein the I/O control system comprises an I/O network operating under the first supply voltage, wherein the partial circuit of the I/O control system represents the I/O network.

12. The input/output (I/O) control system comprising the core power detection circuit of claim 1, wherein the I/O control system comprises:
    an I/O network operating under the first supply voltage, wherein the partial circuit of the I/O control system represents the I/O network, and the I/O network comprises:
        a first group of logic circuits, coupled between the first supply voltage wire and the reference voltage wire.

13. The I/O control system of claim 12, further comprising:
    a core network operating under the second supply voltage, wherein the core network comprises:
        a second group of logic circuits, coupled between the second supply voltage wire and the reference voltage wire.

\* \* \* \* \*